(12) United States Patent
Xiao et al.

(10) Patent No.: US 11,950,046 B2
(45) Date of Patent: Apr. 2, 2024

(54) MULTIFUNCTIONAL SOUNDING DEVICE

(71) Applicant: AAC Microtech (Changzhou) Co., Ltd., Changzhou (CN)

(72) Inventors: Bo Xiao, Shenzhen (CN); Chenliang Kong, Shenzhen (CN); Tong Zhang, Shenzhen (CN); Ronglin Linghu, Shenzhen (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 176 days.

(21) Appl. No.: 17/833,776

(22) Filed: Jun. 6, 2022

(65) Prior Publication Data
US 2023/0292038 A1   Sep. 14, 2023

(30) Foreign Application Priority Data
Mar. 9, 2022  (CN) .................. 202210223006.X

(51) Int. Cl.
*H04R 9/06*   (2006.01)
*H04R 1/02*   (2006.01)
*H04R 1/28*   (2006.01)
*H04R 9/02*   (2006.01)
*H05K 1/18*   (2006.01)

(52) U.S. Cl.
CPC ........... *H04R 1/2811* (2013.01); *H04R 1/026* (2013.01); *H04R 9/025* (2013.01); *H04R 9/06* (2013.01); *H05K 1/189* (2013.01)

(58) Field of Classification Search
CPC ...... H04R 1/2811; H04R 1/026; H04R 9/026; H04R 9/06
See application file for complete search history.

(56) References Cited

U.S. PATENT DOCUMENTS

| | | | | |
|---|---|---|---|---|
| 6,658,133 | B1* | 12/2003 | Usuki | H04R 13/02 381/396 |
| 2017/0142513 | A1* | 5/2017 | Han | H04R 1/323 |
| 2021/0345037 | A1* | 11/2021 | Rhim | H04R 9/043 |
| 2022/0167079 | A1* | 5/2022 | Kim | H04R 1/28 |

* cited by examiner

*Primary Examiner* — Suhan Ni
(74) *Attorney, Agent, or Firm* — W&G Law Group

(57) ABSTRACT

The present invention provides a multifunctional sounding device including a housing, a first vibration system, a second vibration system, a magnetic circuit system, an elastic component and a flexible circuit board. The elastic component includes a deformation part fixed to the second vibration system and an installation part extended from both ends of the deformation part and fixed to the housing. The second vibration system is suspended in the containment cavity through the elastic component. The flexible circuit board is connected with the elastic component, so that the vibration of the flexible circuit board is coupled with the vibration of the elastic component. Therefore, the damping of the elastic component is reduced, the force received by the elastic component during vibration is reduced, and the service life of the elastic component is extended.

10 Claims, 7 Drawing Sheets

MULTIFUNCTIONAL SOUNDING DEVICE

FIELD OF THE PRESENT DISCLOSURE

The invention relates to the technical field of electro-acoustic transducers, in particular to a multifunctional sounding device.

DESCRIPTION OF RELATED ART

The prior art multifunctional sounding device includes a housing, a first vibration system, a second vibration system, a magnetic circuit system and an elastic component. When the multifunctional sounding device works, the magnetic circuit system can drive the first vibration system to vibrate and sound. And the magnetic circuit system can drive the second vibration system to vibrate, wherein the elastic component can facilitate the motion recovery of the vibration assembly. Usually, the magnetic circuit system is indirectly connected to the housing, and this installation method results in poor installation strength of the magnetic circuit system. When the multifunctional sounding device is subjected to external forces such as impact, the connection between the magnetic circuit system and the housing is disconnected, resulting in the multifunctional sounding device not working properly.

Therefore, it is necessary to provide a multifunctional sounding device with higher connection stability.

SUMMARY OF THE PRESENT INVENTION

The purpose of the present invention is to provide a multifunctional sounding device with improved stability.

Accordingly, the present invention provides a multifunctional sounding device, including: a housing; a first vibration system movable along a first direction relative to the housing;

a second vibration system connected to the housing and movable along a second direction and/or movable along a third direction, the second direction being perpendicular to the first direction, and the third direction being perpendicular to the first direction and the second direction;

a magnetic circuit system for driving the first vibration system and the second vibration system to vibrate; wherein along the second direction and/or along the third direction, the magnetic circuit system includes an extension part extending to an outside of the multifunctional sounding device; the magnetic circuit system is fixedly connected to the housing through the extension part for suspending the first vibration system in the containment cavity of the housing; and wherein along the second direction and/or along the third direction, the multifunctional sounding device further includes an elastic component with one end thereof connected to the side wall of the housing and another end connected to the second vibration system for supporting the second vibration system in the containment cavity.

The housing includes an installation hole; at least part of the extension part is located in the installation hole; and the extension part is in contact with the side wall of the installation hole.

The extension part is welded with the side wall of the installation hole.

An amount of the extension parts is at least two, and the extension parts are arranged symmetrically along the second direction and/or along the third direction.

The housing includes a first housing and a second housing, the first housing and the second housing encloses and forms the containment cavity; the first housing is detachably connected to the second housing; the extension part is fixedly connected with the first housing, or the extension part is fixedly connected with the second housing.

The magnetic circuit system includes a main magnet and a secondary magnet, the secondary magnet being arranged around the main magnet to form a magnetic gap. The first vibration system includes a sound membrane and a voice coil, and a part of the sound membrane is in contact with the voice coil. At least part of the voice coil is located in the magnetic gap.

The second vibration system includes a drive coil and a magnetic yoke, the drive coil is fixedly connected with the magnetic yoke, so that the drive coil drives the magnetic yoke to vibrate along the second direction and/or along the third direction; the drive coil includes a first side edge and a second side edge disposed oppositely, along the first direction; the first side edge is arranged opposite to the main magnet, and the second side edge is arranged opposite to the secondary magnet.

The magnetic circuit system further includes a main pole core and a secondary pole core; the main pole core is fixedly connected to the main magnet; the secondary pole core is fixedly connected to the secondary magnet, and the secondary pole core is arranged around the main pole core; the secondary pole core includes a main body part, the extension part is arranged on the main body part, and along the second direction and/or along the third direction, the extension part protrudes from the main body part.

The multifunctional sounding device further includes a plurality of flexible circuit boards, part of the flexible circuit boards and the first vibration system are connected, and part of the flexible circuit board is connected to the secondary pole core, part of the flexible circuit board is connected to the second vibration system The extension part is provided with an avoidance hole, and at least part of the flexible circuit board connected to the secondary pole core is located in the avoidance hole.

The elastic component is connected with the second vibration system through the magnetic yoke.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

The application provides an electronic equipment, which includes a body and a multifunctional sounding device installed on the body. When the multifunctional sounding device is working, the user can control the multifunctional sounding device to sound and/or vibration as required, so as to improve the user experience.

Figure 1:
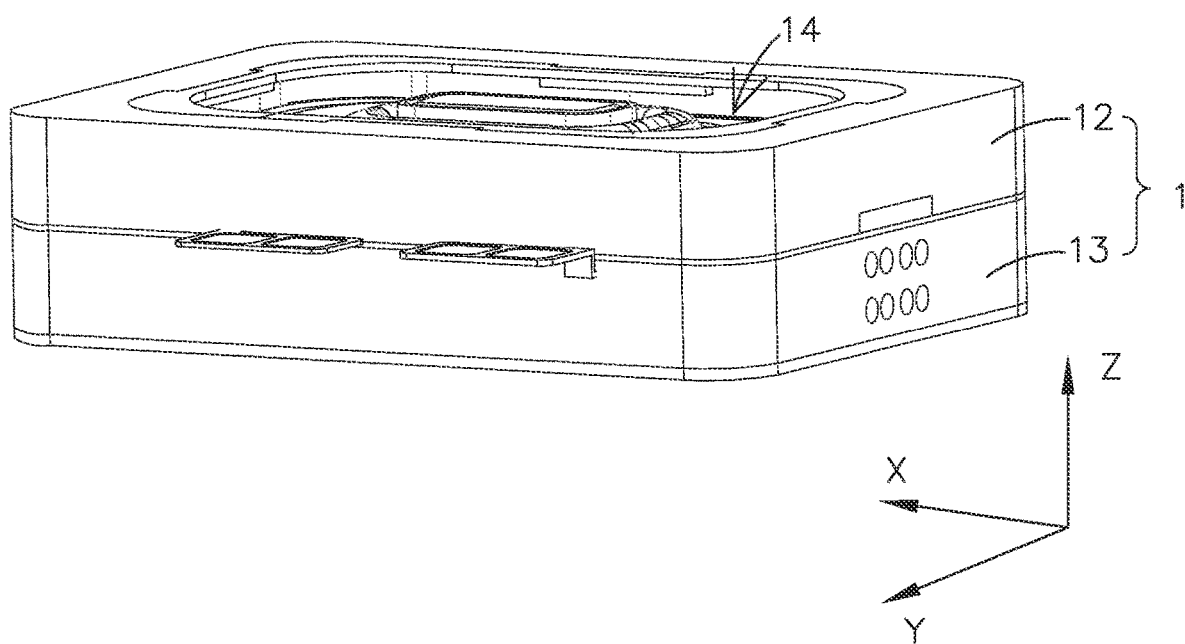
FIG. 1 is an isometric view of a multifunctional sounding device provided by an embodiment of the present invention.

As shown in FIG. 1, a first direction Z, a second direction X and a third direction Y are defined, and first direction Z is the vibration direction of the first vibration system 2. The second direction X and/or the third direction Y are the vibration directions of the second vibration system 3. The second direction X is perpendicular to the first direction Z, and the third direction Y is perpendicular to both the first direction and the second direction.

Figure 2:
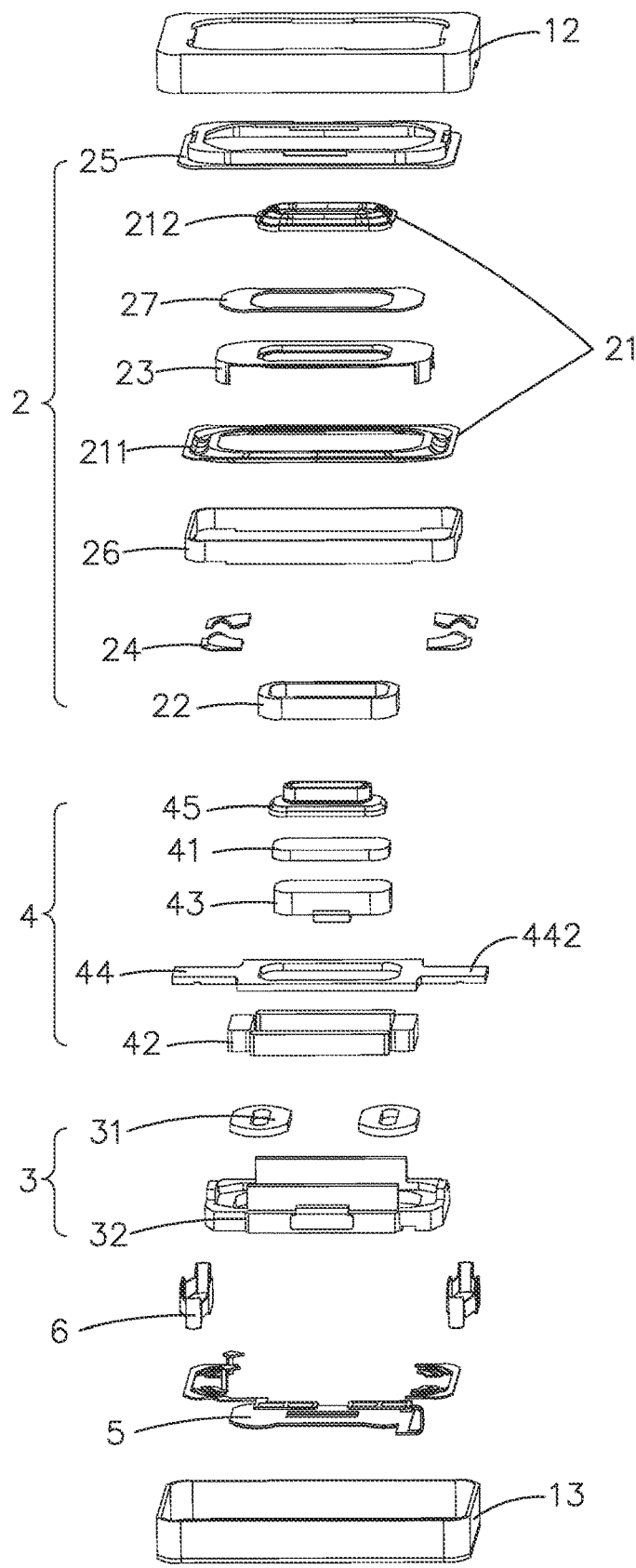
FIG. 2 is an exploded view of the multifunctional sounding device FIG. 1.

Specifically, as shown in FIG. 1 and FIG. 2, the multifunctional sounding device includes: housing 1, first vibration system 2, second vibration system 3, magnetic circuit system 4, flexible circuit board 5 and elastic component 6. The magnetic circuit system 4 is fixedly connected to the housing 1. The first vibration system 2 is suspended in the containment cavity 14 of the housing 1 through the magnetic circuit system 4. One end of elastic component 6 is connected to the side wall of housing 1. The other end of elastic component 6 is connected with second vibration system 3. The second vibration system 3 is suspended in the containment cavity 14 through the elastic component 6. The flexible circuit board 5 is used to connect the multifunctional sounding device with external electronic parts, so as to facilitate the use of the multifunctional sounding device. Wherein, the magnetic circuit system 4 is used to drive the first vibration system 2 to vibrate along the first direction Z to sound, and the magnetic circuit system 4 is used to drive the second vibration system 3 to vibrate along the second direction X and/or along the third direction Y. The multifunctional sounding device is arranged with both a vibration feedback function and a voice feedback function, thereby improving the performance of the multifunctional sounding device.

As shown in FIG. 2, the magnetic circuit system 4 includes a main magnet 41 and a secondary magnet 42, and the secondary magnet 42 is arranged around the main magnet 41 to form a magnetic gap. The magnetic circuit system 4 further includes a main pole core 43 attached to the main magnet 41, a secondary pole core 44 attached to the secondary magnet 42 surrounding the main pole core 43, and an upper magnet 45 attached to the main pole core 43 away from the main magnet 41. The secondary magnet 42 is installed in the containment cavity 14 of the housing 1 through the secondary pole core 44, the installation of secondary magnet 42 is simplified, the number of parts required for secondary magnet 42 installation is reduced, the space of the containment cavity 14 occupied by the installation of the secondary magnet 42 is thus reduced, this in turn reduces the size of the multifunctional sounding device. While reducing the production cost of the multifunctional sounding device, the space required for the installation of the multifunctional sounding device is reduced, so as to facilitate the installation and application of the multifunctional sounding device.

Figure 3:
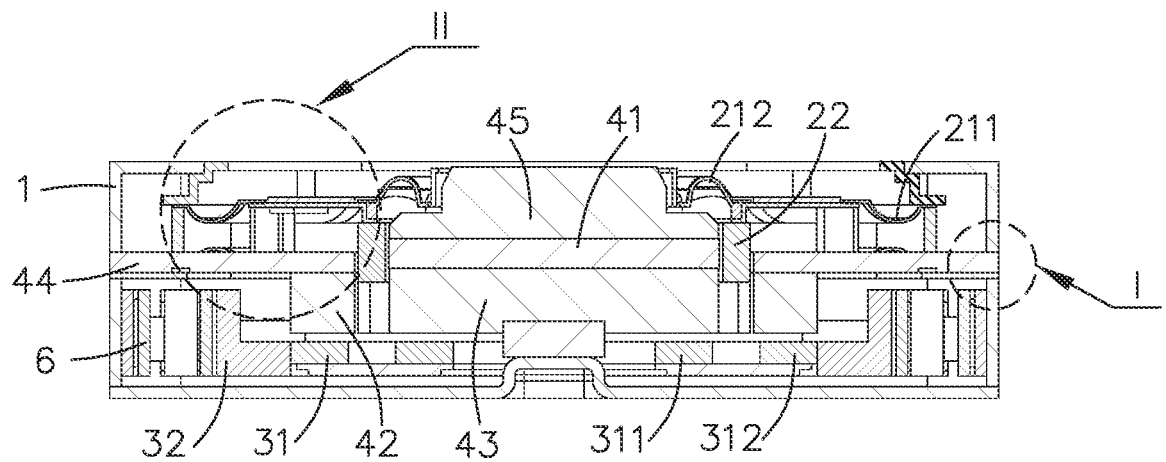
FIG. 3 is a cross-sectional view of the multifunctional sounding device.
Figure 4:
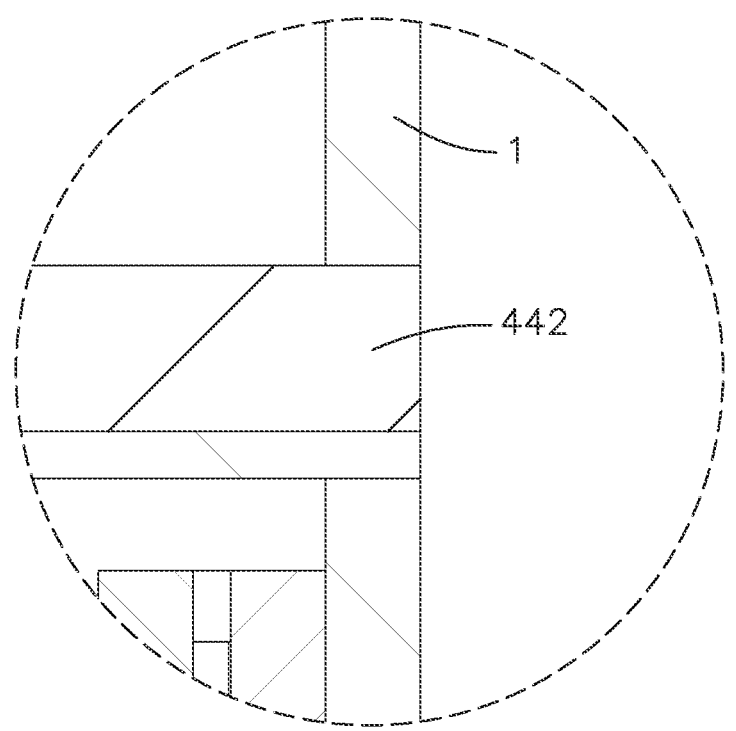
FIG. 4 is an enlarged view of part I in FIG. 3.
Figure 6:
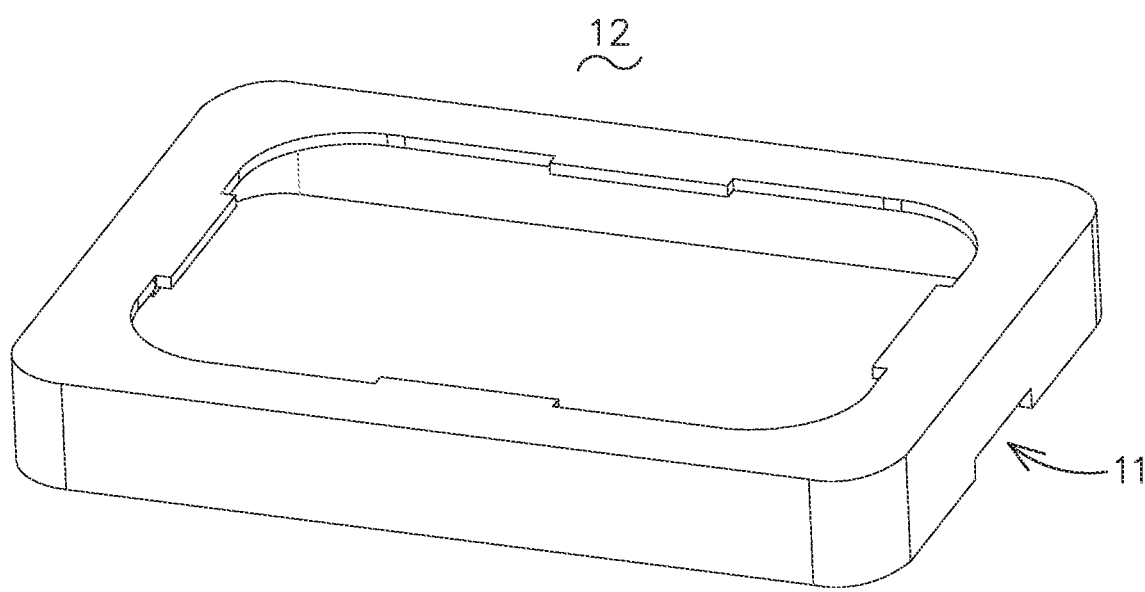
FIG. 6 is an isometric view of a first housing in FIG. 2.
Figure 7:
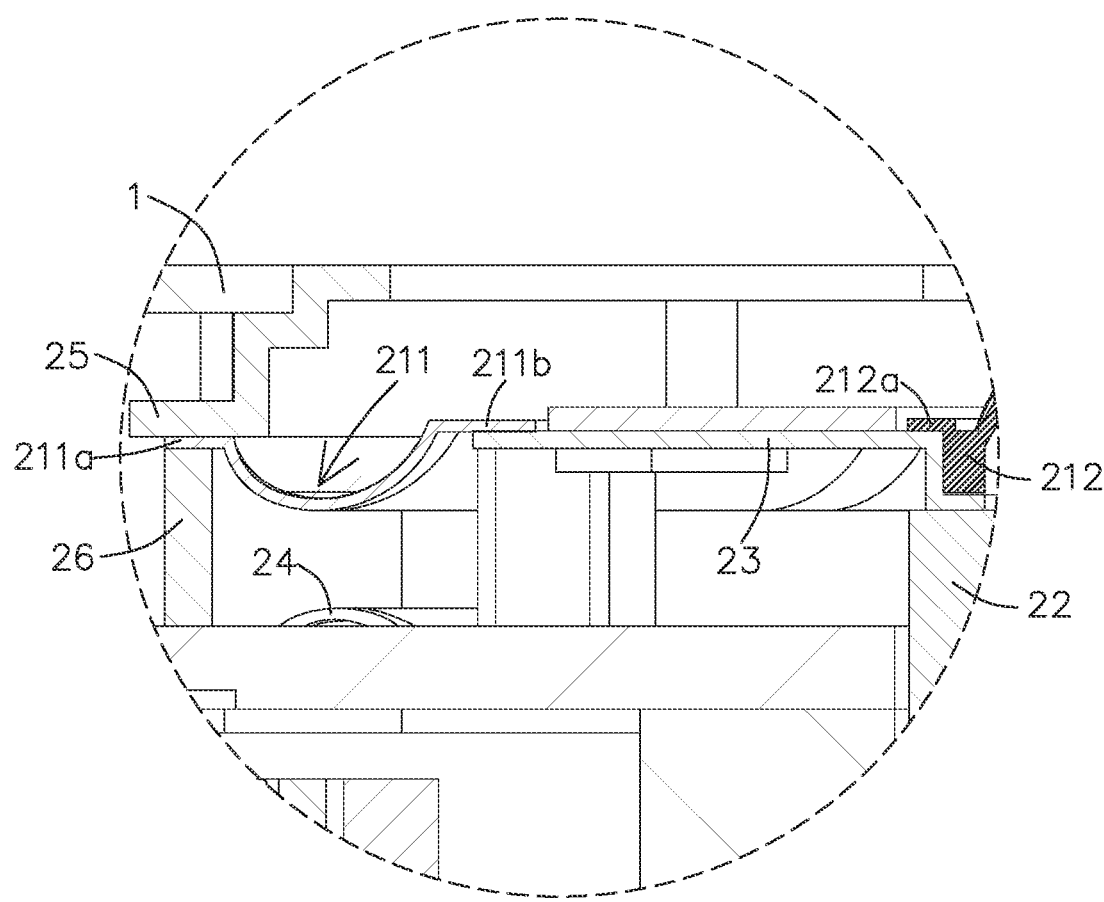
FIG. 7 is an enlarged view of part II in FIG. 3.
Figure 8:
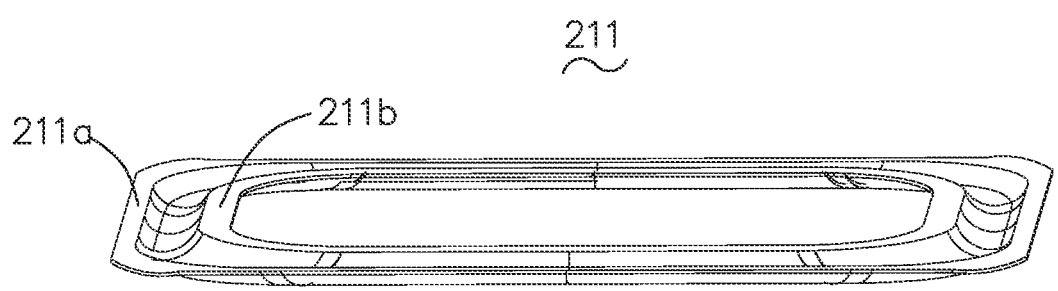
FIG. 8 is an isometric view of a first membrane in FIG. 6.
Figure 9:
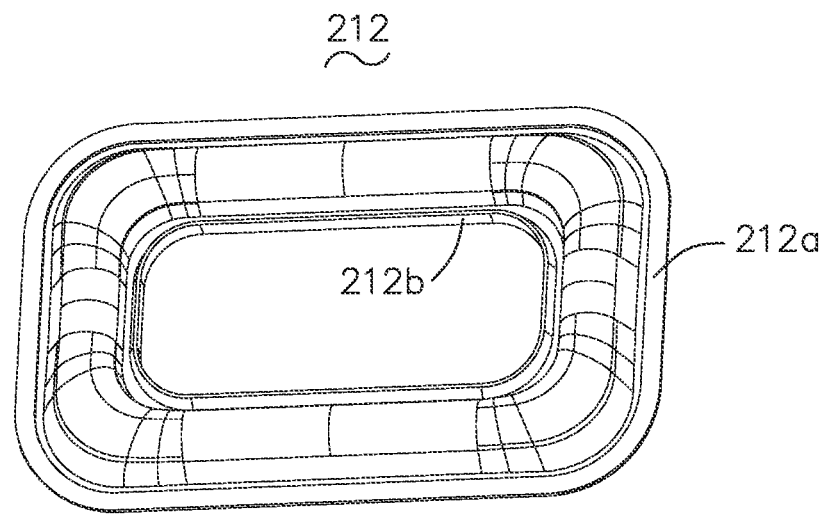
FIG. 9 is an isometric view of a second membrane in FIG. 6.
Figure 10:
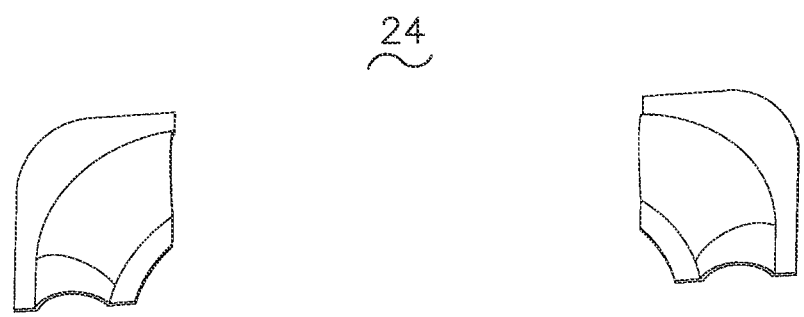
FIG. 10 is an isometric view of a vibration diaphragm in FIG. 6.
Figure 10:
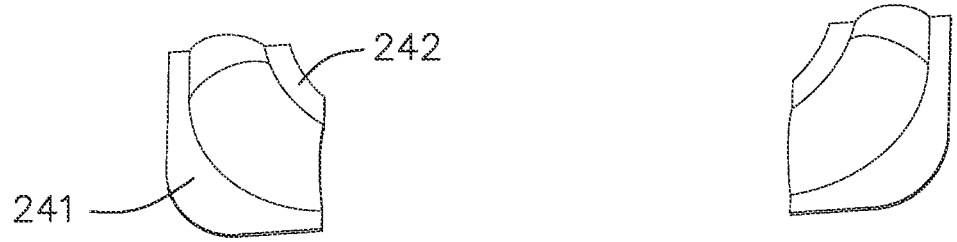

As shown in FIG. 2, the first vibration system 2 includes a sound membrane 21 and a voice coil 22. The sound membrane 21 includes a first membrane 211 and a second membrane 212. As shown in FIG. 8 and FIG. 9, the first membrane 211 is provided with a first connection part 211a and a second connection part 211b. The second membrane 212 is provided with a third connection part 212a and a fourth connection part 212b. As shown in FIG. 2, along the first direction Z, the first vibration system 2 also includes an upper frame 25 and a lower frame 26 oppositely arranged, a vibration diaphragm 24 arranged opposite to the sound membrane 21, and a skeleton 23 arranged between the sound membrane 21 and the vibration diaphragm 24. As shown in FIG. 10, the vibration diaphragm 24 is provided at the fifth connection part 241 and the sixth connection part 242. As shown in FIG. 2, FIG. 3 and FIG. 6, the first connection part 211a of the first membrane 211 is sandwiched between the upper frame 25 and the lower frame 26. The second connection part 211b of the first membrane 211 is connected to one end of the skeleton 23, and the other end of the skeleton 23 is connected to the sixth connection part 242 of the vibration diaphragm 24. The fifth connection part 241 of the vibration diaphragm 24 is connected to the inner side wall of the housing 1. Wherein, skeleton 23 is provided with installation slot 231 and through hole 232. The third connection part 212a of the second membrane 212 is connected to the voice coil 22 through the side wall of the installation slot 231. At least part of the upper magnet 45 is connected to the fourth connection part 212b of the second membrane 212 through the through hole 232.

In the embodiment of the application, when the multifunctional sounding device works, the voice coil 22 draws an alternating current from the outside. At this time, the voice coil 22 moves along the first direction Z under the action of the magnetic field generated by the main magnet 41 and the secondary magnet 42, and drives the sound membrane 21 to vibrate along the first direction Z through the skeleton 23, making the first vibration system 2 vibrate and sound.

Wherein, as shown in FIG. 2, the first vibration system 2 also includes a dome 27, which is fixed on the skeleton 23 and located between the first connection part 211a and the third connection part 212a. Through dome 27, the strength of skeleton 23 can be strengthened, the torsion resistance and anti-sway ability of skeleton 23 can be improved, and the acoustic performance of first vibration system 2 can be improved.

As shown in FIG. 2, the second vibration system 3 includes a drive coil 31 and a magnetic yoke 32. The drive coil 31 is fixedly connected to the magnetic yoke 32 so that the drive coil 31 drives the magnetic yoke 32 to vibrate along the second direction X and/or along the third direction Y. As shown in FIG. 3, the drive coil 31 includes a first side edge 311 and a second side edge 312 that are disposed opposite to each other. Along the first direction Z, the first side edge 311 is placed opposite to the main magnet 41, and the second side edge 312 is placed opposite to the secondary magnet 42. One end of elastic component 6 is connected to the side wall of housing 1, and the other end of elastic component 6 is connected to magnetic yoke 32. When the second vibration system 3 moves along the second direction X and/or along the third direction Y, the elastic component 6 can undergo elastic deformation.

In the embodiment of the application, when the multifunctional sounding device is working, the drive coil 31 main magnet 41 and the magnetic field generated by the secondary magnet 42 move along the second direction X and/or along the third direction Y, so that the second vibration system 3 vibrates. The magnetic circuit system 4 drives the magnetic yoke 32 to move through the drive coil 31, which simplifies the structure of the magnetic circuit system 4 driving the second vibration system 3 to vibrate. Therefore, the structure of the multifunctional sounding device is simplified, and the production cost of the multifunctional sounding device is reduced.

When the second vibration system 3 vibrates, the elastic component 6 undergoes elastic deformation under the action of the magnetic yoke 32 and produces a rebound force. When the magnetic yoke 32 removes the restriction on the elastic component 6 or the current direction changes, the resilient force generated by the elastic component 6 can drive the second vibration system 3 to reset, so as to facilitate the next movement of the second vibration system 3. Therefore, setting the elastic component 6 is beneficial to the multiple and continuous work of the second vibration system 3, thereby improving the working stability and performance of the second vibration system 3. This further improves the working stability of the multifunctional sounding device.

The number of elastic components 6 is multiple, and the elastic components 6 are arranged symmetrically along the second direction X and/or along the third direction Y.

In the embodiment of the application, a plurality of elastic components 6 is arranged symmetrically along the second direction X and/or along the third direction Y, that is, the plurality of elastic components 6 are evenly distributed around the magnetic yoke 32. The force on the magnetic yoke 32 is evenly distributed to avoid the unstable movement of the second vibration system 3 caused by the unilateral force on the magnetic yoke 32. Thereby, the stability of the movement of the second vibration system 3 is improved, which in turn improves the working stability of the multifunctional sounding device.

As shown in FIG. 2 and FIG. 3, in order to improve the installation stability of the magnetic circuit system 4, the magnetic circuit system 4 is provided with an extension part 442 extending to the outside of the multifunctional sounding device along the second direction X and/or along the third direction Y. Magnetic circuit system 4 is fixedly connected to housing 1 through extension part 442.

In the embodiment of the application, the magnetic circuit system 4 is directly and fixedly connected to the housing 1 through the extension part 442 to avoid the connection failure of the secondary pole core 44 caused by external force during the use and transportation of the multifunctional sounding device. This increases the stability of the installation of the secondary pole core 44, which in turn increases the stability of the multifunctional sounding device.

Figure 5:
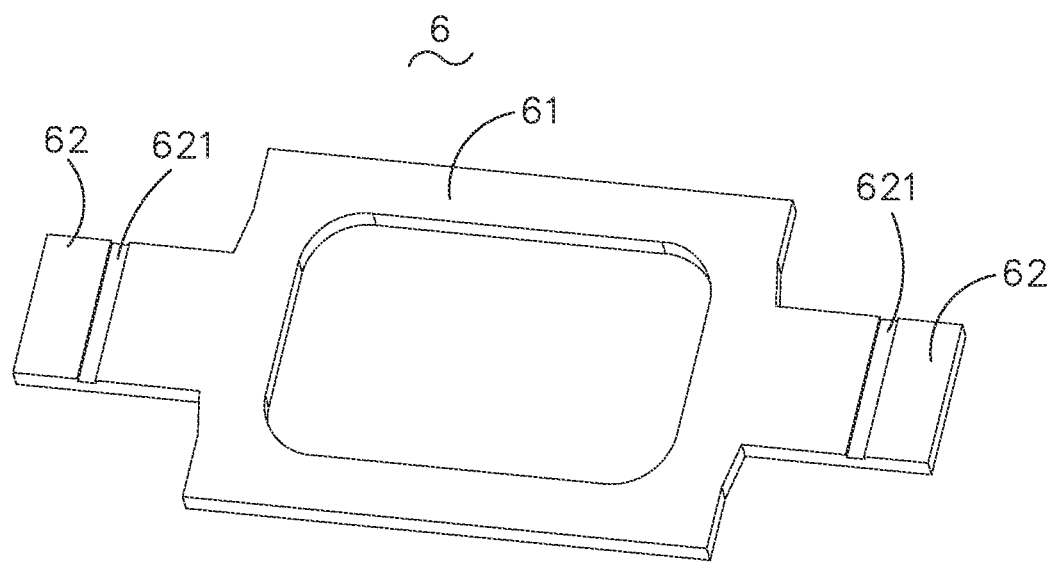
FIG. 5 is an isometric view of a secondary magnet in FIG. 2.

Wherein, as shown in FIG. 2 and FIG. 5, the secondary pole core 44 includes a main body part 441, an extension part 442 is disposed on the main body part 441, and the extension part 442 protrudes from the main body part 441 along the second direction X and/or along the third direction Y.

In the embodiment of the application, setting the extension part 442 on the secondary pole core 44 can facilitate the connection between the extension part 442 and the housing 1. It is avoided that the extension part 442 is located on other structures to cause the structure of the extension part 442 to be complicated, thereby simplifying the structure of the extension part 442.

Figure 11:
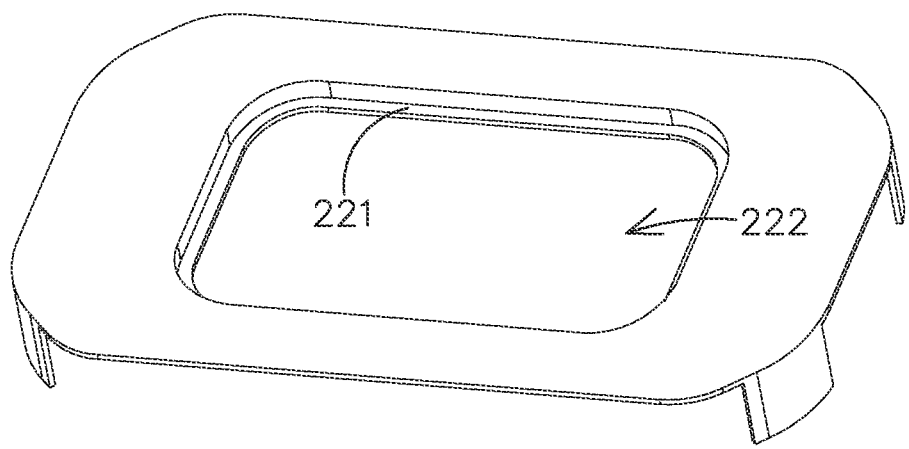
FIG. 11 is an isometric view of a skeleton in FIG. 6.

Specifically, as shown in FIG. 2 and FIG. 11, the housing 1 is provided with an installation hole 11, at least a part of the extension part 442 is located in the installation hole 11, and the extension part 442 is in contact with the side wall of the installation hole 11.

In the embodiment of the application, the extension part 442 is in contact with the side wall of the installation hole 11 to limit the movement of the secondary pole core 44 relative to the housing 1, thereby facilitating the installation of the secondary pole core 44. Avoiding the offset of the secondary pole core 44 causes the connection between the secondary pole core 44 and the housing 1 to fail, thereby further improving the stability of the connection between the secondary pole core 44 and the housing 1.

More specifically, the extension part 442 is welded to the side wall of the installation hole 11.

In the embodiment of the application, the extension part 442 is welded with the side wall of the installation hole 11, which simplifies the connection between the secondary pole core 44 and the housing 1. While ensuring the stable connection between the secondary pole core 44 and the housing 1, the space required for the installation of the secondary pole core 44 in the housing 1 is reduced. Thus, the space occupation of the containment cavity 14 by the secondary pole core 44 is reduced. In addition, the connection method between the secondary pole core 44 and the housing 1 may also be clip connection, bonding, or the like. The application does not specifically limit the specific connection method between the secondary pole core 44 and the housing 1.

The number of extension parts 442 is multiple, and the multiple extension parts 442 are symmetrically arranged along the second direction X and/or along the third direction Y.

In the embodiment of the application, the extension part 442 will be subjected to the force of the housing 1 during the installation, use and transportation of the secondary pole core 44. Multiple extension parts 442 are arranged symmetrically, so that the secondary pole core 44 is subjected to uniform force. The secondary pole core 44 is prevented from being damaged due to uneven force, thereby prolonging the service life of the secondary pole core 44.

Specifically, as shown in FIG. 2, the housing 1 includes a first housing 12 and a second housing 13. The first housing 12 and the second housing 13 enclose a containment cavity 14. The first housing 12 and the second housing 13 are detachably connected. The extension part 442 is connected to the first housing 12, or the extension part 442 is connected to the second housing 13.

In the embodiment of the application, the housing 1 is divided into the first housing 12 and the second housing 13, which can facilitate the installation, maintenance and replacement of various parts in the containment cavity 14. Thereby prolonging the service life of each part, thereby prolonging the service life of the multifunctional sounding device.

As shown in FIG. 2, the extension part 442 is provided with an avoidance hole 442a, and at least a part of the flexible circuit board 5 is located in the avoidance hole 442a.

In the embodiment of the application, the extension part 442 is provided with an avoidance hole 442a, and during the installation process, at least part of the flexible circuit board 5 is located in the avoidance hole 442a. Avoid the interference between flexible circuit board 5 and extension part 442, so that secondary pole core 44 cannot be installed. This improves the accuracy and stability of the secondary pole core 44 installation. At the same time, damage to the flexible circuit board 5 due to interference between the secondary pole core 44 and the flexible circuit board 5 is avoided, thereby prolonging the service life of the flexible circuit board 5.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A multifunctional sounding device, including:
    a housing;
    a first vibration system movable along a first direction relative to the housing;
    a second vibration system connected to the housing and movable along a second direction and/or movable along a third direction, the second direction being perpendicular to the first direction, and the third direction being perpendicular to the first direction and the second direction;
    a magnetic circuit system for driving the first vibration system and the second vibration system to vibrate; wherein
    along the second direction and/or along the third direction, the magnetic circuit system includes an extension part extending to an outside of the multifunctional sounding device; the magnetic circuit system is fixedly connected to the housing through the extension part for suspending the first vibration system in the containment cavity of the housing; and wherein
    along the second direction and/or along the third direction, the multifunctional sounding device further includes an elastic component with one end thereof connected to the side wall of the housing and another end connected to the second vibration system for supporting the second vibration system in the containment cavity.

2. The multifunctional sounding device as described in claim 1, wherein the housing includes an installation hole; at least part of the extension part is located in the installation hole; and the extension part is in contact with the side wall of the installation hole.

3. The multifunctional sounding device as described in claim 2, wherein the extension part is welded with the side wall of the installation hole.

4. The multifunctional sounding device as described in claim 1, wherein an amount of the extension parts is at least two, and the extension parts are arranged symmetrically along the second direction and/or along the third direction.

5. The multifunctional sounding device as described in claim 1, wherein the housing includes a first housing and a second housing, the first housing and the second housing encloses and forms the containment cavity; the first housing is detachably connected to the second housing; the extension part is fixedly connected with the first housing, or the extension part is fixedly connected with the second housing.

6. The multifunctional sounding device as described in claim 1, wherein,
    the magnetic circuit system includes a main magnet and a secondary magnet, the secondary magnet being arranged around the main magnet to form a magnetic gap;
    the first vibration system includes a sound membrane and a voice coil, and a part of the sound membrane is in contact with the voice coil so that the voice coil the sound membrane is driven to vibrate along the first direction to produce sound; at least part of the voice coil is located in the magnetic gap;
    the second vibration system includes a drive coil and a magnetic yoke, the drive coil is fixedly connected with the magnetic yoke, so that the drive coil drives the magnetic yoke to vibrate along the second direction and/or along the third direction; the drive coil includes a first side edge and a second side edge disposed oppositely, along the first direction; the first side edge is arranged opposite to the main magnet, and the second side edge is arranged opposite to the secondary magnet.

7. The multifunctional sounding device as described in claim 6, wherein the magnetic circuit system further includes a main pole core and a secondary pole core; the main pole core is fixedly connected to the main magnet; the secondary pole core is fixedly connected to the secondary magnet, and the secondary pole core is arranged around the main pole core;
    the secondary pole core includes a main body part, the extension part is arranged on the main body part, and along the second direction and/or along the third direction, the extension part protrudes from the main body part.

8. The multifunctional sounding device as described in claim 6, wherein, the multifunctional sounding device further includes a plurality of flexible circuit boards, part of the flexible circuit boards and the first vibration system are connected, and part of the flexible circuit board is connected to the secondary pole core, part of the flexible circuit board is connected to the second vibration system;
    the extension part is provided with an avoidance hole, and at least part of the flexible circuit board connected to the secondary pole core is located in the avoidance hole.

9. The multifunctional sounding device as described in claim 6, wherein the elastic component is connected with the second vibration system through the magnetic yoke.

10. An electronic equipment, wherein the electronic equipment includes:
    a main body and a multifunctional sounding device as described in claim 1, wherein the multifunctional sounding device is installed on the main body.

* * * * *